(12) United States Patent
Puago Martinez

(10) Patent No.: US 12,025,352 B2
(45) Date of Patent: Jul. 2, 2024

(54) ELECTROHYDRODYNAMIC HEAT SINK

(71) Applicant: CEDRION CONSULTORIA TECNICA E INGENIERIA SL, Leganes (ES)

(72) Inventor: Hector Puago Martinez, Leganes (ES)

(73) Assignee: CEDRION CONSULTORIA TECNICA E INGENIERIA SL, Leganes (ES)

( * ) Notice: Subject to any disclaimer, the term of this patent is extended or adjusted under 35 U.S.C. 154(b) by 908 days.

(21) Appl. No.: 17/044,964

(22) PCT Filed: Mar. 29, 2019

(86) PCT No.: PCT/ES2019/070214
§ 371 (c)(1),
(2) Date: Oct. 2, 2020

(87) PCT Pub. No.: WO2019/193225
PCT Pub. Date: Oct. 10, 2019

(65) Prior Publication Data
US 2021/0164704 A1   Jun. 3, 2021

(30) Foreign Application Priority Data

Apr. 2, 2018 (ES) ................. ES201830328

(51) Int. Cl.
*F25B 21/00* (2006.01)
*H01T 19/00* (2006.01)
*H05K 7/20* (2006.01)

(52) U.S. Cl.
CPC .............. *F25B 21/00* (2013.01); *H01T 19/00* (2013.01); *H05K 7/2039* (2013.01)

(58) Field of Classification Search
CPC .......... F25B 21/00; H01T 19/00; H01L 23/46; H01L 23/467; G06F 1/20; G06F 1/203
See application file for complete search history.

(56) References Cited

U.S. PATENT DOCUMENTS

2008/0302510 A1* 12/2008 Ouyang ................ H01L 23/467
165/80.3
2009/0168344 A1* 7/2009 Ploeg .................... H01L 23/467
361/690

(Continued)

FOREIGN PATENT DOCUMENTS

JP       H09252068 A     9/1997

OTHER PUBLICATIONS

International Search Report for Corresponding International Application No. PCT/ES2019/070214 (3 Pages) (Jun. 7, 2019).

*Primary Examiner* — Marc E Norman
(74) *Attorney, Agent, or Firm* — LUCAS & MERCANTI, LLP

(57) ABSTRACT

An electrohydrodynamic heat sink is provided which has a base electrode receiving heat from a heat source to be dissipated, the base electrode having a shape that converges with a cavity wherein a fluid is placed during use, and a corona electrode which is arranged in the cavity of the base electrode, the corona electrode being connected to an electric power source (P.S) in order to ionise the fluid of the base electrode and generate an ion wind (w) from the corona electrode to the base electrode, so as to generate a laminar current of the fluid in order to discharge the heat from the cavity.

10 Claims, 4 Drawing Sheets

(56) References Cited

U.S. PATENT DOCUMENTS

2010/0307724 A1    12/2010   Ichii
2012/0175663 A1     7/2012   Lee et al.
2023/0024941 A1*    1/2023   Mulay .................... H05K 7/202

* cited by examiner

ELECTROHYDRODYNAMIC HEAT SINK

CROSS REFERENCE TO RELATED APPLICATION

This Application is a 371 of PCT/ES2019/070214, filed on Mar. 29, 2019, which, in turn, claimed the priority of Spanish Patent Application No. P201830328, filed Apr. 2, 2018, each of which are incorporated herein by reference.

TECHNICAL FIELD

The present invention relates to the cooling of microscale components. The invention proposes a heat sink that enables ions to be accelerated under the effect of an electric field to move a fluid in order to release heat into the environment. The invention is applicable to the thermal control of a wide variety of components or equipment, being especially suitable for the field of electronics.

STATE OF THE ART

EHD devices that use electrohydrodynamic technology are known, which produce a corona effect that makes it possible to ionise a fluid surrounding a charged conductor. These devices are mainly used as fluid conditioning devices in various sectors, typically as precipitators.

EHD devices offer advantages given the reduction in their size, their low weight and low power consumption, as well as reduced noise and vibration. These features mean that they are being used in cooling applications for microscale components instead of conventional heat sinks or fans.

The EHD devices currently used in cooling take advantage of the corona effect to direct a current of air towards a heat dissipation element equipped with fins arranged downstream from the EHD device, such that the EHD device is used to generate a movement in the air inside the component intended to be cooled and the fins of the heat sink are in charge of receiving the heat and dissipating it. The EHD devices used in cooling are conventionally known as EHD pumps, since the function thereof is to drive air, with the heat sink being what performs the heat sinking function. See, for example, document US2012314334A1.

There are also a number of academic studies that envision devices with different designs, as reflected in the document "Recent advances in electrohydrodynamic pumps operated by ionic winds: a review" published in 2017 by Michael J Johnson and David B Go.

Using heat sinks with a fin arrangement increases the size of the equipment required for cooling, which is particularly counterproductive in microscale components, such as those used in the field of electronics. Furthermore, conventional heat sinks equipped with fins which generate the same problems of the field of fluid mechanics, such as the effect from the boundary layer, heat transfer, or the distribution of temperature.

Therefore, a solution that enables EHD technology to be used in cooling applications without needing to use heat sinks equipped with fins is required to reduce the size of the heat dissipation element in order to improve the integration thereof with the component to be cooled.

OBJECT OF THE INVENTION

The invention refers to a microscale electrohydrodynamic (EHD) heat sink which moves a fluid by means of the corona effect, increasing the transfer of heat with respect to conventional solutions and thereby improving the cooling of the component wherein the electrohydrodynamic heat sink is arranged.

The electrohydrodynamic heat sink comprises:
  a base electrode receiving heat from a heat source to be dissipated, the base electrode having a shape that converges with a cavity wherein a fluid is placed during use, and
  a corona electrode which is arranged in the cavity of the base electrode, the corona electrode being connected to an electric power source in order to ionise the fluid of the base electrode and generate an ion wind from the corona electrode to the base electrode, so as to generate a laminar current of the fluid in order to discharge the heat from the cavity.

In this manner, a heat sink is obtained which integrates the generation function of the laminar current of the fluid and the heat-sinking function in a single device, preventing needing to use a heat sink with fins as in the solutions in the state of the art.

Preferably, the corona electrode is separated from the base electrode at a minimum distance of between 1 and 5 mm in order to enable a suitable ionisation of the fluid.

The cavity of the base electrode has a bottom and side walls arranged in continuity with the bottom.

Preferably, the side walls are separated from each other at a distance which is at least 5 times the minimum separation distance from the corona electrode to the base electrode.

According to an exemplary embodiment of the invention, the cavity is U-shaped with arched edges in the junction between the bottom and the side walls.

The fluid in the cavity of the base electrode is a dielectric fluid, such as water or air.

If air at atmospheric pressure is used as a fluid, the corona electrode is electrically powered between a minimum value of 500-2000 volts and a maximum value of 3000-7000 volts. This provides sufficient power to ensure ionisation and in turn prevents electric arcs from being generated. In this case, the corona electrode has a tip with a radius of between 5 and 100 microns.

Preferably, the corona electrode has an elongated shape which extends substantially parallel to the bottom of the cavity of the base electrode.

According to another exemplary embodiment of the invention, the heat sink additionally comprises a channel arranged between the side walls and the corona electrode. Preferably, the channel consists of two walls arranged on both sides of the corona electrode, which extend in a direction perpendicular to the bottom of the cavity.

According to another exemplary embodiment of the invention, the base electrode has two or more cavities, wherein a single corona electrode is arranged in each of the cavities.

DETAILED DESCRIPTION OF THE INVENTION

Figure 1:
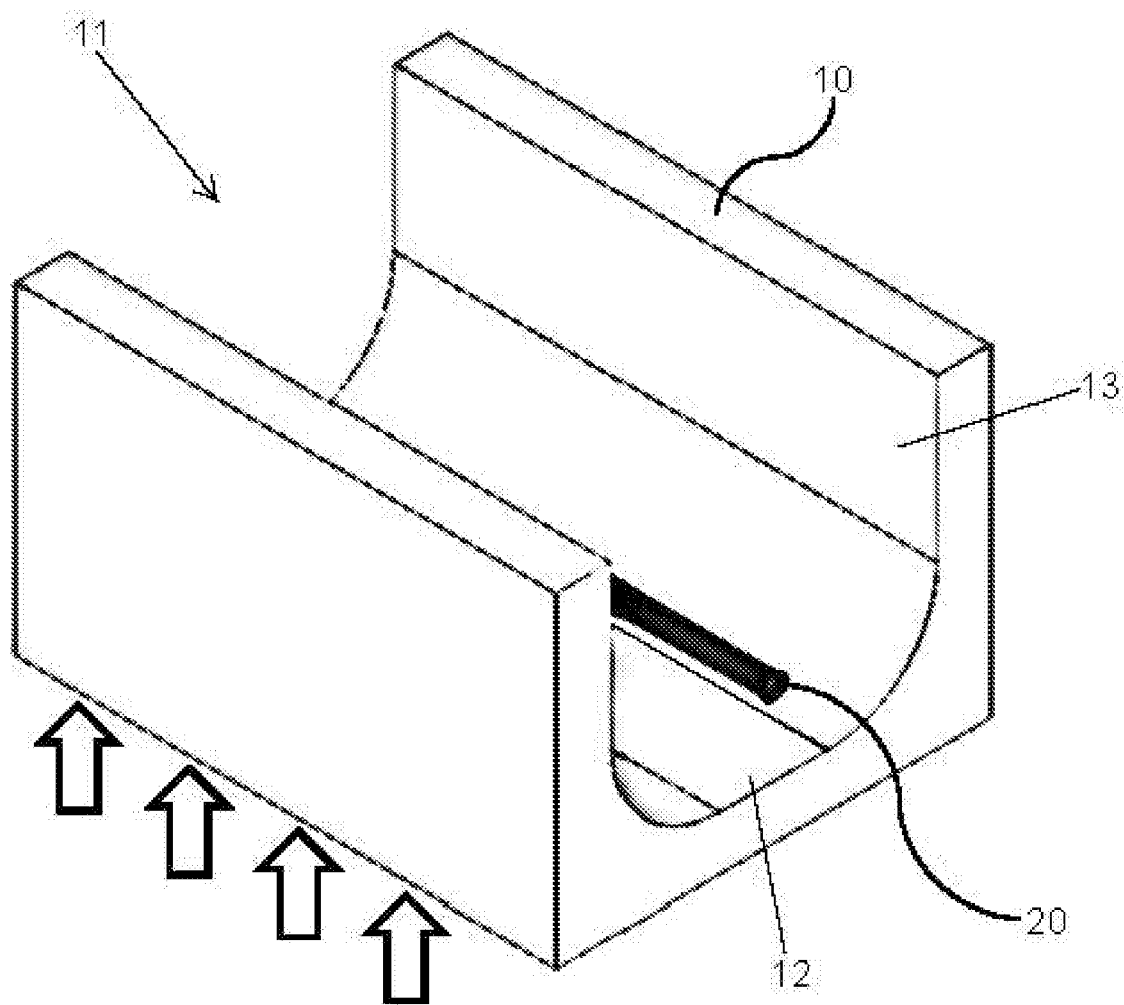
FIG. 1 shows a perspective view of a first exemplary embodiment of the electrohydrodynamic (EHD) heat sink of the invention.
Figure 2:
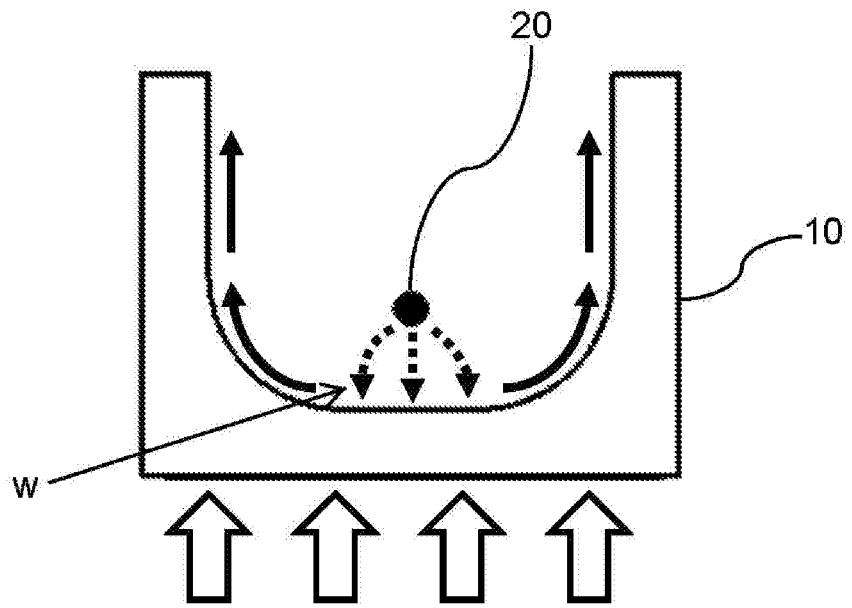
FIG. 2 shows a front view of the heat sink of FIG. 1, wherein it shows the ion wind generated between the electrodes of the heat sink and the laminar current generated for discharging heat from the cavity.
Figure 3:
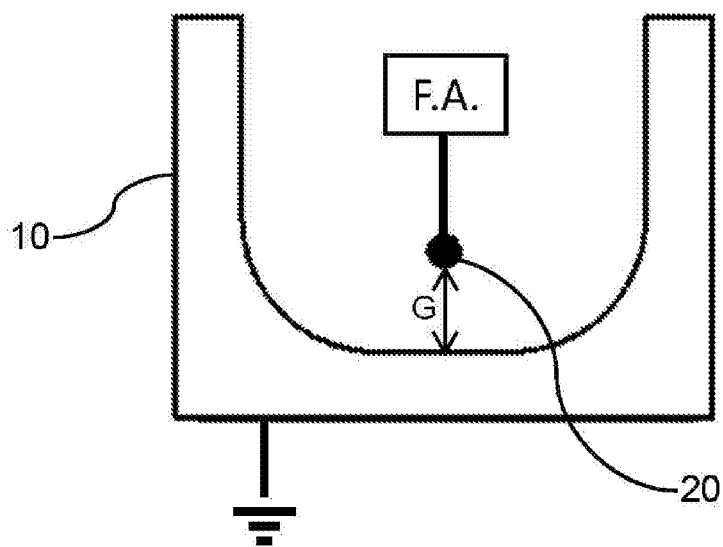
FIG. 3 shows a schematic view of the electric power source of the heat sink of the previous figures.

FIGS. 1 to 3 show an electrohydrodynamic (EHD) heat sink according to a first exemplary embodiment of the invention. The EHD heat sink is intended to be arranged in a component or equipment which has a source for generating heat that needs to be dissipated, such as an electronic component or equipment.

The EHD heat sink comprises a base electrode (10) and a corona electrode (20).

The electrodes (10, 20) are made of an electrically conductive solid material. The selection of the type of material will depend on the heat dissipation requirements of the component or equipment wherein the heat sink is arranged.

The base electrode (10) has an outer face which is exposed to the heat source and an inner face, opposite from the outer face, wherein the cavity (11) containing the fluid is arranged.

The cavity (11) has a bottom (12) and side walls (13) arranged in continuity with the bottom (12).

The base electrode (10) has a shape which converges with the cavity (11) wherein a fluid is placed during use, while the corona electrode (20) is arranged in that cavity (11). The corona electrode (20) is connected to an electric power source (P.S), while the base electrode (10) is preferably connected to ground.

With this arrangement, the base electrode (10) receives the heat to be dissipated, while when the corona electrode (20) is electrically powered during use, a corona effect is produced between the corona electrode (20) and the base electrode (10). The electric field generated between the electrodes (10, 20) ionises the fluid of the cavity (11), producing an electrohydrodynamic effect and with it an ion wind (w) from the corona electrode (20) to the base electrode (10). The ion wind (w) generates a laminar current of the fluid which absorbs heat from the base electrode (10) and causes heat to be discharged towards the outside of the cavity (11). The laminar current of the fluid is generated by the impact of the ions moving with the neutral particles of the fluid.

FIG. 2 illustrates the operation of the heat sink, wherein the dashed arrows represent the ion wind (w), the solid arrows represent the laminar current for discharging the heat, and the larger arrows represent the heat received by the base electrode (10) from the heat source.

The corona electrode (20) is separated from the base electrode (10) at a minimum distance (G), such that for a potential difference given by the corona effect, the electric field generated around the corona electrode (20) is sufficient to ionise the surrounding fluid remaining in a corona discharge regime and not in an electric arc regime.

Preferably, the minimum distance (G) at which the corona electrode (20) is separated from the base electrode (10) is between 1 and 5 mm.

As shown in FIG. 3, the minimum distance (G) is set as the minimum distance existing between the corona electrode (20) and the bottom (12) of the cavity (11) of the base electrode (10).

Preferably, the side walls (13) of the cavity (11) are separated from each other at a distance which is at least 5 times the minimum distance (G). This separation enables the ion wind (w) to have a single component, which is mainly vertical, i.e. the flow of ions to be directed from the corona electrode (20) to the bottom (12) of the cavity (11) of the base electrode (10), which is the area wherein most of the heat to be dissipated concentrates, since it is the outer face of the base electrode (10) which is directly exposed to the heat.

FIGS. 1 to 4 show a cavity (11) that is U-shaped with arched edges in the junction between the bottom (12) and the side walls (13). FIG. 5 shows other exemplary embodiments of the bottom (12) and the side walls (13) of the cavity (11). For example, the cavity (11) can be U-shaped with a right angle between the bottom (12) and the side walls (13), it can be U-shaped with an obtuse angle between the bottom (12) and the side walls (13), or the cavity (11) can have a circular shape. In any case, the distance between the side walls (13), the angle thereof (13) with respect to the bottom (12), or the shape of the cavity (11) are not essential; for the purposes of the invention, it is only necessary for the base electrode (10) to have a cavity (11) and for the ion wind (w) to be generated from the corona electrode (20) towards the base electrode (10).

The circular shape of the cavity (11) has a smaller contact surface exposed to the flow of heat than the U-shapes in FIG. 5. However, it has no edges in the transition between the side walls (13) and the bottom (12), this transition being continuous in the case of the cavity with a circular shape, which prevents the creation of pooling or sudden shocks that slow down the flow and can reduce the cooling. For this reason, the preferred shape of the cavity (11) is shown in FIGS. 1 to 4 with the arched edges in the junction between the bottom (12) and the side walls (13).

The fluid in the cavity (11) is a dielectric fluid which can be ionised by the corona effect, i.e. a non-conductive fluid. For example, the fluid can be a gas or a liquid, such as air or water. Industrial coolant can also be used as a fluid.

The corona electrode (20) is connected to the positive terminal of the electric power source (P.S), wherein the electric signal can be of any known type, such as DC, AC or PDC.

The conditions of the electric power source of the corona electrode (20) vary depending on the fluid used. For example, using air at atmospheric pressure as a fluid, the corona electrode (20) is electrically powered at a minimum value of 500-2000 volts, sufficient to ensure that the air is ionised, and a maximum value of 3000-7000 volts, ensuring that no electric arcing is produced. Under these conditions concerning the electric power source, the corona electrode (20) has a tip with a radius of between 5 and 100 microns.

Figure 6:
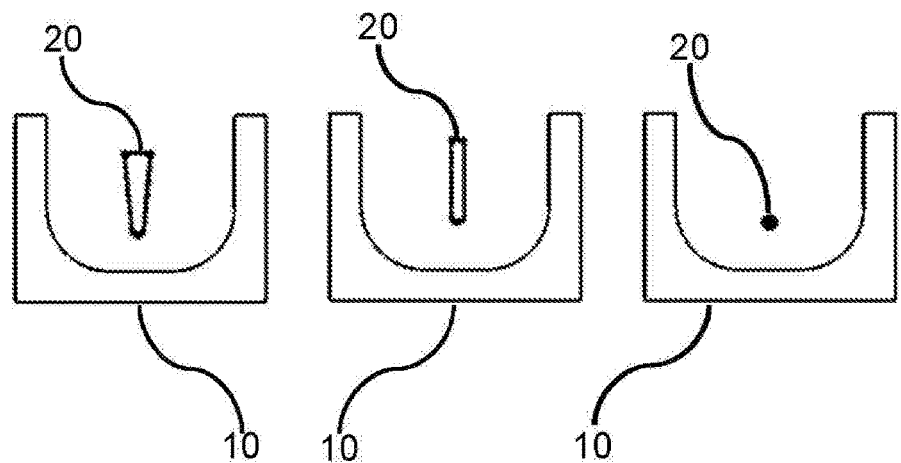
FIG. 6 shows different shapes of the corona electrode arranged in the cavity of the base electrode.

The corona electrode (20) has an elongated shape which extends substantially parallel to the bottom (12) of the cavity (11) of the base electrode (10). In addition to this elongated configuration, FIG. 6 shows the different shapes that the corona electrode (20) can have.

Figure 4:
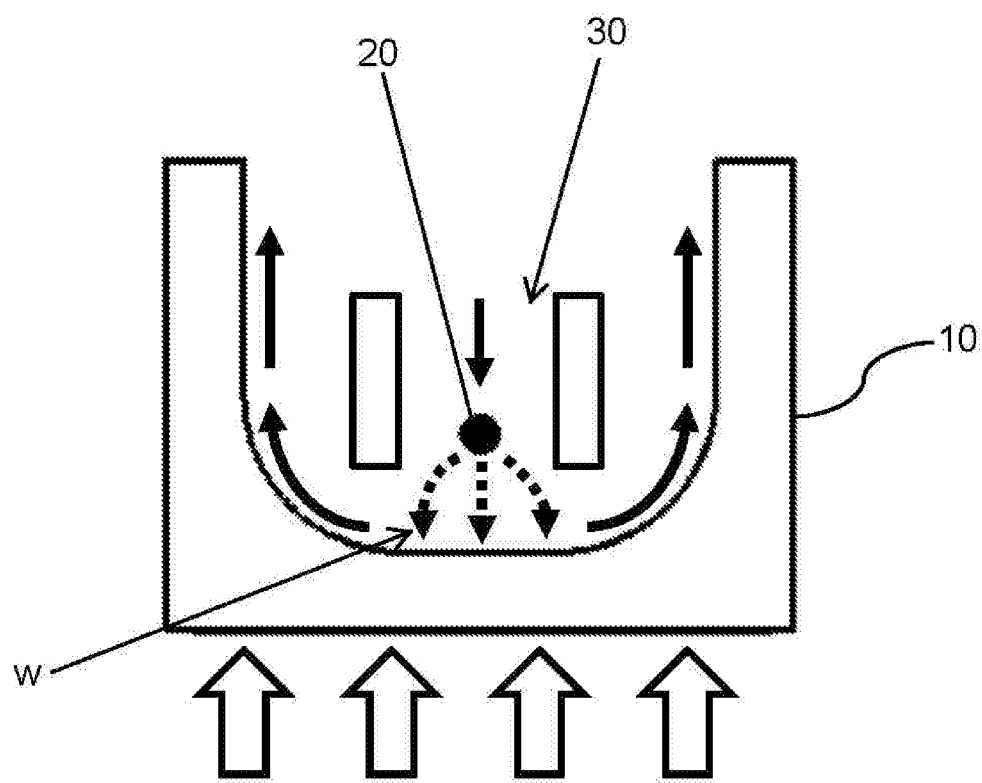
FIG. 4 shows a view of a second exemplary embodiment of the electrohydrodynamic (EHD) heat sink of the invention.
Figure 5:
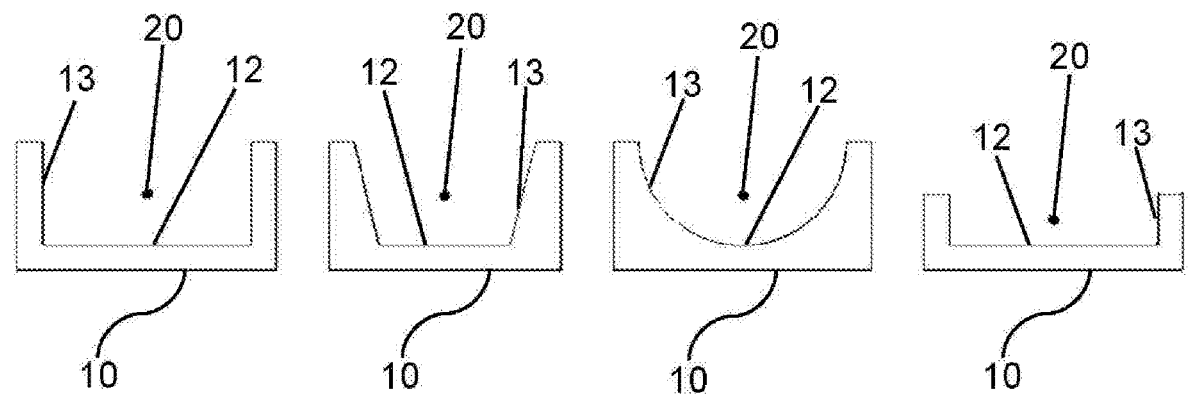
FIG. 5 shows different shapes of the cavity of the base electrode.

FIG. 4 shows a heat sink according to a second exemplary embodiment of the invention. The second exemplary embodiment is identical to the first exemplary embodiment described above in FIGS. 1 to 3 and differs only in that the heat sink additionally comprises means for channeling the ion wind.

The means for channeling the ion wind (w) comprise a channel (30) arranged in the cavity (11) of the base electrode (10) between the side walls (13) of the cavity (11) and the corona electrode (20).

The channel (30) is made of an electrically insulating material so that it does not alter the electric field established between the two electrodes (10,20).

The channel (30) consists of two walls arranged on both sides of the corona electrode (20), which extend in a direction perpendicular to the bottom (12) of the cavity (11). The channel (30) restricts the movement of the flow of ions of the fluid in a direction perpendicular to the bottom (12), creating a fluid circuit wherein the cold fluid passes between the walls of the channel (30) in order to be directed to the bottom (12) of the cavity (11), and from the bottom it is discharged to the outside of the cavity (11) along the side walls (13), such that as it travels along the inner face of the cavity (11) the fluid absorbs heat from the base electrode (10).

The channel (30) improves cooling conditions by separating the cold fluid from the hot fluid and further enables a more compact heat recuperator, since the channel (30) acts as an electrostatic barrier so that the ions of the fluid do not travel in an undesired direction.

FIGS. 1 to 6 show a heat sink with the corona electrode (20) arranged in the cavity (11) of the base electrode (10) although, depending on the cooling needs, a base electrode (10) with two or more cavities (11) could be used, wherein a single corona electrode (20) is arranged in each of the cavities (11).

The isolated operation of a corona electrode (20) with respect to the other corona electrodes (20) that could be placed in a modular manner prevents shielding effects between them at the electrostatic level and prevents opposing currents of fluid from being generated which reduce cooling.

The invention claimed is:

1. An electrohydrodynamics heat sink, comprising:
a base electrode receiving heat from a heat source to be dissipated, the base electrode having a shape that converges with a cavity wherein a fluid is placed during use, and
a corona electrode arranged in the cavity of the base electrode, the corona electrode connected to an electric power source (P.S) in order to ionise the fluid of the base electrode and generate an ion wind (w) from the corona electrode to the base electrode, so as to generate a laminar current of the fluid in order to discharge the heat from the cavity,
wherein the corona electrode is separated from the base electrode at a minimum distance (G) of between 1 and 5 mm, and
wherein the cavity has a bottom and side walls arranged in continuity with the bottom, and wherein the side walls are separated from each other at a distance which is at least 5 times the minimum distance (G).

2. The electrohydrodynamic heat sink according to claim 1, wherein the cavity is U-shaped with arched edges in the junction between the bottom and the side walls.

3. The electrohydrodynamic heat sink according to claim 1, wherein the fluid of the cavity of the base electrode is a dielectric fluid.

4. The electrohydrodynamic heat sink according to claim 3, wherein the dielectric fluid is water or air.

5. The electrohydrodynamic heat sink according to claim 4, wherein the air is at atmospheric pressure, the corona electrode being electrically powered between a minimum value comprised between 500-2000 volts and a maximum value comprised between 3000-7000 volts.

6. The electrohydrodynamic heat sink according to claim 5, wherein the corona electrode has a tip with a radius of between 5 and 100 microns.

7. The electrohydrodynamic heat sink according to claim 1, wherein the corona electrode has an elongated shape which extends parallel to the bottom of the cavity of the base electrode.

8. The electrohydrodynamic heat sink according to claim 1, further comprising a channel arranged between the side walls and corona electrode.

9. The electrohydrodynamic heat sink according to claim 8, wherein the channel consists of two walls, each wall arranged on each side of the corona electrode which extend in a direction perpendicular to the bottom of the cavity.

10. The electrohydrodynamic heat sink according to claim 1, wherein the base electrode has two or more cavities, wherein a single corona electrode is arranged in each of the cavities.

* * * * *